US012626640B2

(12) United States Patent (10) Patent No.: US 12,626,640 B2
Kyles et al. (45) Date of Patent: May 12, 2026

(54) SYSTEMS AND METHODS FOR CONFIGURING A DISPLAY DEVICE AND DISPLAY SYSTEM

(71) Applicant: Snap Inc., Santa Monica, CA (US)

(72) Inventors: Ian Kyles, West Linn, OR (US); Clive David Beech, Plymouth (GB)

(73) Assignee: Snap Inc., Santa Monica, CA (US)

( * ) Notice: Subject to any disclaimer, the term of this patent is extended or adjusted under 35 U.S.C. 154(b) by 0 days.

(21) Appl. No.: 18/620,536

(22) Filed: Mar. 28, 2024

(65) Prior Publication Data

US 2024/0242663 A1 Jul. 18, 2024

Related U.S. Application Data

(63) Continuation of application No. 17/817,528, filed on Aug. 4, 2022, now Pat. No. 11,984,062.

(60) Provisional application No. 63/229,642, filed on Aug. 5, 2021.

(51) Int. Cl.
*G09G 3/32* (2016.01)
*H10H 29/14* (2025.01)

(52) U.S. Cl.
CPC ............. *G09G 3/32* (2013.01); *H10H 29/142* (2025.01); *G09G 2370/00* (2013.01)

(58) Field of Classification Search
CPC ...................................................... H10K 59/18
See application file for complete search history.

(56) References Cited

U.S. PATENT DOCUMENTS

| | | | | | |
|---|---|---|---|---|---|
| 6,791,382 | B1* | 9/2004 | Ting | ........................ | H03L 7/197 |
| | | | | | 348/E5.077 |
| 2002/0163513 | A1 | 11/2002 | Tsuji | | |
| 2005/0078104 | A1 | 4/2005 | Matthies et al. | | |
| 2006/0077193 | A1* | 4/2006 | Thielemans | ............ | G09F 15/00 |
| | | | | | 345/204 |
| 2009/0322649 | A1* | 12/2009 | Hamer | ................. | G09G 3/2085 |
| | | | | | 345/1.3 |
| 2014/0326295 | A1* | 11/2014 | Moslehi | .................. | H10F 19/75 |
| | | | | | 438/59 |

(Continued)

FOREIGN PATENT DOCUMENTS

| | | |
|---|---|---|
| CN | 110390907 A | 10/2019 |
| CN | 113035128 A | 6/2021 |

(Continued)

OTHER PUBLICATIONS

"Chinese Application Serial No. 202280053280.5, Office Action mailed Nov. 20, 2024", W/English Translation, 14 pgs.

(Continued)

*Primary Examiner* — Bipin Gyawali

(74) *Attorney, Agent, or Firm* — Schwegman Lundberg & Woessner, P.A.

(57) ABSTRACT

Displays, systems, and methods may be utilized in applications including, but not limited to, projectors, head-up displays, and augmented reality (AR), mixed reality (MR), and virtual reality (VR) systems or devices, such as headsets or other near-eye devices or systems. Tiled or Tile-able displays and methods, in accordance with the present invention, provide displays of varying sizes, and as such, a Tiled or Tile-able display is configured to accommodate the display size needed for various wearable and mobile devices that require or incorporate displays.

20 Claims, 9 Drawing Sheets

(56) References Cited

U.S. PATENT DOCUMENTS

| | | | |
|---|---|---|---|
| 2015/0301781 A1* | 10/2015 | Ekkaia | F21V 17/105 |
| | | | 362/237 |
| 2017/0025593 A1* | 1/2017 | Bower | H10H 29/142 |
| 2018/0323180 A1* | 11/2018 | Cok | G09G 3/2014 |
| 2019/0155556 A1 | 5/2019 | Tsujita et al. | |
| 2020/0090574 A1 | 3/2020 | Sakariya et al. | |
| 2021/0166619 A1 | 6/2021 | Kim et al. | |
| 2021/0217740 A1 | 7/2021 | Lee | |
| 2021/0225268 A1 | 7/2021 | Peng et al. | |
| 2021/0313298 A1* | 10/2021 | Archer | H01L 25/0655 |
| 2022/0122520 A1 | 4/2022 | Cok et al. | |
| 2022/0209066 A1 | 6/2022 | Tan et al. | |
| 2022/0230582 A1 | 7/2022 | Cok et al. | |
| 2022/0236571 A1 | 7/2022 | Popovich et al. | |
| 2022/0254952 A1 | 8/2022 | Fabien et al. | |
| 2022/0352412 A1* | 11/2022 | Brodoceanu | H01L 24/27 |
| 2022/0415698 A1* | 12/2022 | Huang | H10H 29/0364 |
| 2023/0040711 A1 | 2/2023 | Kyles et al. | |
| 2023/0213700 A1 | 7/2023 | Ward et al. | |
| 2023/0222955 A1 | 7/2023 | Sakariya et al. | |
| 2023/0238398 A1* | 7/2023 | Choi | H10D 86/60 |

FOREIGN PATENT DOCUMENTS

| | | | |
|---|---|---|---|
| CN | 113066788 A | 7/2021 | |
| CN | 121531876 A | 2/2026 | |
| JP | 2003031853 A | 1/2003 | |
| JP | 2010199428 A | 9/2010 | |
| JP | 2012511811 A | 5/2012 | |
| JP | 2015194515 A | 11/2015 | |
| JP | 2017161634 A | 9/2017 | |
| JP | 2018530792 A | 10/2018 | |
| JP | 2018206986 A | 12/2018 | |
| JP | 2025108576 A | 7/2025 | |
| KR | 100881142 B1 | 2/2009 | |
| WO | WO-2016200882 A1 | 12/2016 | |
| WO | WO-2021142243 A1 | 7/2021 | |
| WO | WO-2023015257 A1 | 2/2023 | |
| WO | WO-2023015257 A9 | 2/2024 | |

OTHER PUBLICATIONS

"Chinese Application Serial No. 202280053280.5, Response filed Feb. 21, 2025 to Office Action mailed Nov. 20, 2024", W/English Claims, 12 pgs.

"Chinese Application Serial No. 202280053280.5, Voluntary Amendment filed Jun. 20, 2024", W/English Claims, 10 pgs.

"European Application Serial No. 22765358.1, Notification Regarding Rule 164 and Article 94(3) EPC mailed Oct. 22, 2024", 15 pgs.

"European Application Serial No. 22765358.1, Voluntary Amendment filed Mar. 5, 2024", 91 pgs.

"Japanese Application Serial No. 2024-506998, Notification of Reasons for Refusal mailed Dec. 24, 2024", w/ English translation, 9 pgs.

"Japanese Application Serial No. 2024-506998, Notification of Reasons for Rejection mailed Jun. 25, 2024", w/ English machine translation, 10 pgs.

"Japanese Application Serial No. 2024-506998, Notification of Reasons for Rejection mailed Sep. 24, 2024", w/ English machine translation, 7 pgs.

"Japanese Application Serial No. 2024-506998, Response filed Mar. 13, 2025 to Notification of Reasons for Refusal malled Dec. 24, 2024", w/ current English claims, 14 pgs.

"Japanese Application Serial No. 2024-506998, Response filed Sep. 24, 2024 to Notification of Reasons for Rejection mailed Jun. 25, 2024", w/ English claims, 19 pgs.

"Japanese Application Serial No. 2024-506998, Response Filed Dec. 13, 2024 toNotification of Reasons for Rejection mailed Sep. 24, 2024", w/ English Claims, 14 pgs.

"Korean Application Serial No. 10-2024-7007225, Notice of Preliminary Rejection mailed Feb. 14, 2025", W/English Translation, 4 pgs.

"Korean Application Serial No. 10-2024-7007225, Notice of Preliminary Rejection mailed Jul. 25, 2024", w/ English translation, 10 pgs.

"Korean Application Serial No. 10-2024-7007225, Response filed Sep. 25, 2024 to Notice of Preliminary Rejection mailed Jul. 25, 2024", 9 pgs.

"U.S. Appl. No. 17/817,528, Non Final Office Action mailed Oct. 4, 2023", 10 pgs.

"U.S. Appl. No. 17/817,528, Notice of Allowance mailed Jan. 11, 2024", 11 pgs.

"U.S. Appl. No. 17/817,528, Response filed Nov. 14, 2023 to Non Final Office Action mailed Oct. 4, 2023", 9 pgs.

"International Application Serial No. PCT/US2022/074542, International Preliminary Report on Patentability mailed Feb. 15, 2024", 11 pgs.

"International Application Serial No. PCT/US2022/074542, International Search Report mailed Jan. 5, 2023", 6 pgs.

"International Application Serial No. PCT/US2022/074542, Invitation to Pay Additional Fees mailed Nov. 11, 2022", 9 pgs.

"International Application Serial No. PCT/US2022/074542, Written Opinion mailed Jan. 5, 2023", 9 pgs.

"Chinese Application Serial No. 202280053280.5, Office Action mailed Jun. 19, 2025", w/ English translation, 8 pgs.

"Chinese Application Serial No. 202280053280.5, Response filed Aug. 1, 2025 to Office Action mailed Jun. 19, 2025", W/English Claims, 12 pgs.

"European Application Serial No. 22765358.1, Response Filed Jan. 17, 2025 to Notification Regarding Rule 164 and Article 94(3) EPC mailed Oct. 22, 2024", 19 pgs.

"Korean Application Serial No. 10-2024-7007225, Notice of Preliminary Rejection mailed Feb. 14, 2025", w/ English Claims, 11 pgs.

"European Application Serial No. 25194372.6, Response filed Dec. 31, 2025 to Extended European Search Report mailed Nov. 14, 2025", 65 pgs.

"Japanese Application Serial No. 2025-066253, Notification of Reasons for Rejection mailed Feb. 3, 2026", W/English Translation, 8 pgs.

\* cited by examiner

SYSTEMS AND METHODS FOR CONFIGURING A DISPLAY DEVICE AND DISPLAY SYSTEM

CROSS REFERENCE TO RELATED APPLICATION

This patent application is a continuation of U.S. patent application Ser. No. 17/817,528, filed Aug. 4, 2022, which application claims the benefit of U.S. Provisional Patent Application No. 63/229,642, filed Aug. 5, 2021, entitled "SYSTEMS AND METHODS FOR CONFIGURING A DISPLAY DEVICE AND DISPLAY SYSTEM", each of which are incorporated by reference herein in their entirety.

TECHNICAL FIELD

This disclosure relates to displays, for example, light-emitting diode (LED) displays, including LED displays and OLED displays, as well as microdisplays or micro versions of the same (e.g., microLED and microOLED displays). More particularly, the present disclosure is directed to configurable LED displays.

BACKGROUND

Typically, direct-view applications, with medium-sized displays for portable, wearable, mobile or handheld devices (i.e. not Micro Displays, and not monitors, TVs, etc.), are typically made with transmissive LCD or OLED technology with TFT backplanes. OLED displays suffer from short lifetime and limited brightness, while LCD displays require a backlight, which dissipates power for every pixel whether the pixel is on or off. TFTs, while inexpensive, have excess resistance (which wastes power) and are too large to make sophisticated circuitry under each pixel, and are thus limited to drive schemes in which each row of the display is driven in turn, with each pixel having a very short duty cycle, thus requiring high current densities in order to get adequate brightness. In contrast, while microLED displays have a long life, microLED array when coupled to the silicon-backplane to form a microLED display often may yield displays with random defects.

In constructing micro-LED displays with silicon backplanes for physically larger applications (i.e. not microdisplays, but direct-view displays such as those for VR headsets, wearables such as watches, and smartphones or even monitors and televisions), building a variety of shapes and sizes would normally require redesigning the display and manufacturing process for each new application. As the size of the display gets larger, yield continually reduces, making some applications cost-prohibitive or at least non-competitive.

SUMMARY

Displays, in accordance with embodiments of the present disclosure, may be utilized in applications including, but not limited to, projectors, head-up displays, and augmented reality (AR), mixed reality (MR), and virtual reality (VR) systems or devices, such as headsets or other near-eye devices or systems. Tiled or Tile-able displays and methods, in accordance with embodiments of the present disclosure, provide displays of varying sizes, and as such, a Tiled or Tile-able display is configured to accommodate the display size needed for various wearable and mobile devices that require or incorporate displays.

DETAILED DESCRIPTION

As required, detailed embodiments are disclosed herein. It must be understood that the disclosed embodiments are merely exemplary of various and alternative forms. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

The disclosure uses a display composed of independently and individually-fabricated and independently-tested "Tiles" (solving the yield limitation, as they are smaller and are tested during manufacturing process, and may be repaired before the manufacturing process is complete, thereby increasing yield). Further, different wearable or mobile device manufacturers try to differentiate themselves with industrial designs that lead to widely-varying display sizes and shapes, which would necessitate new designs for each customer, but using a Tiled or Tile-able display and method, in accordance with embodiments of the present disclosure, allows new displays to be designed or configured by arraying the Tiles on a PCB (which can be rapidly designed and fabricated as compared to creating a new silicon die and microLED array).

Figure 1:
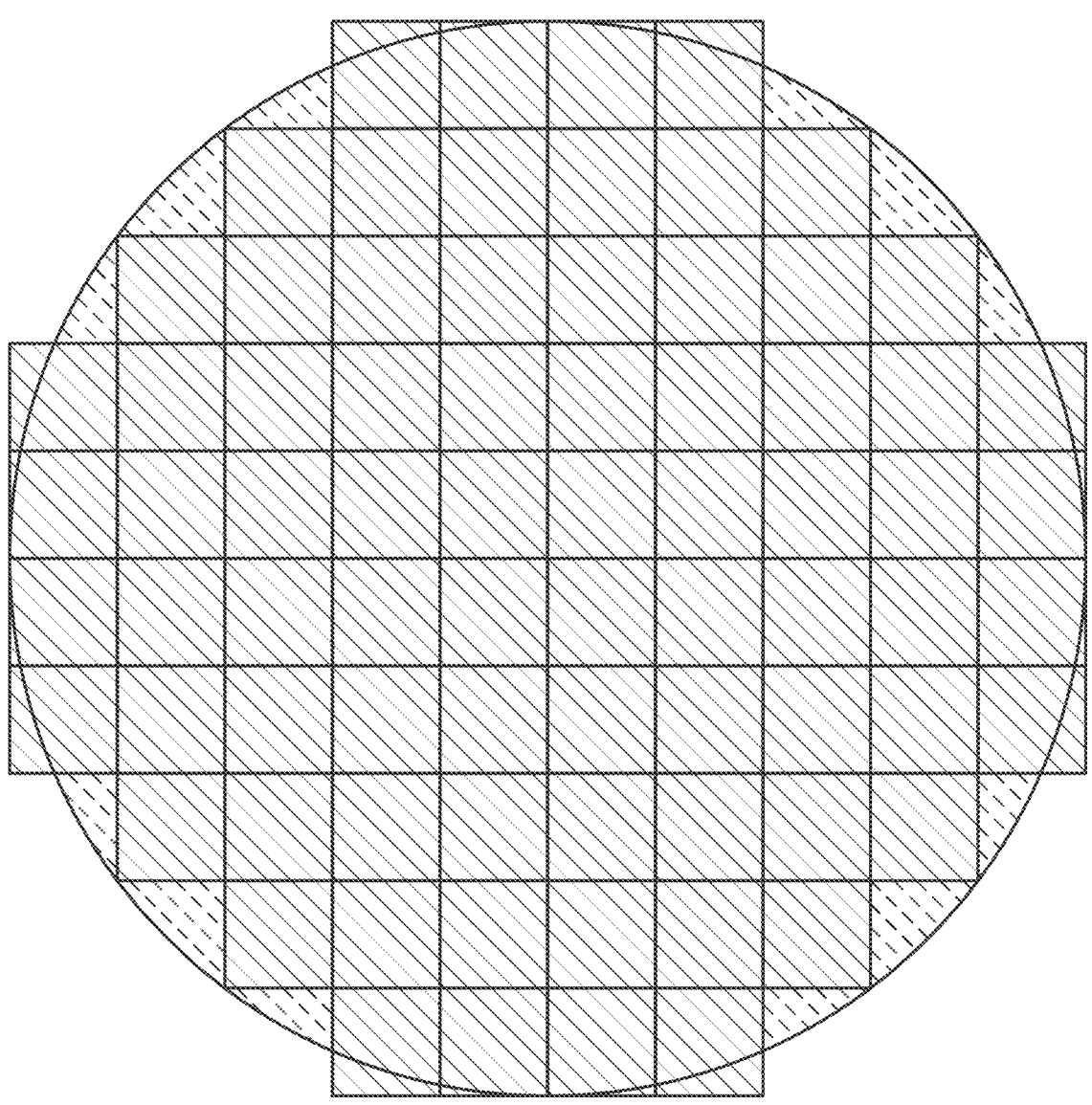
FIG. 1 illustrates an array of Tiles for a circular watch display in accordance with embodiments of the present disclosure.

FIG. 1 illustrates a pseudo-circular array of display Tiles. In an embodiment of the present disclosure an array of Tiles or display Tiles approximates a circle, and may be utilized to serve as a display device (e.g., an LED display device or LED panel) for a circular device. In an embodiment of the present disclosure, any number of Tiles can be arranged in any shape. In an embodiment of the present disclosure, an Illumination Device (e.g., a Tile) includes an Illumination Die (e.g., an LED Die) and an Operational Die (e.g., a Backplane Die).

In an embodiment of the present disclosure, an Illumination Die (e.g., an LED Die) includes Illuminating Elements coupled to or integrated into an Illumination Substrate (e.g., a Ga N substrate). In an embodiment of the present disclosure Illuminating Elements, for example, an array of Illuminating Elements (e.g., LEDs of any type or size) are formed in the Illumination Substrate. The Illuminating Elements (e.g., LEDs) or Illumination Array (e.g., an array of Illumination Elements) and the Illumination Substrate (e.g., an LED substrate) are integrated and/or coupled together, and form an Illumination Die. (e.g., an LED Die).

In an embodiment of the present disclosure, pixels are formed when the Illuminating Elements of the Illumination Die are coupled (e.g., electrically coupled) to circuitry (which includes at least pixel circuitry) that controls or is utilized to operate (e.g., including driving the respective Illumination Element or Illumination Elements). In an embodiment of the present disclosure, the pixel circuitry includes at least drive circuitry. In an embodiment of the present disclosure the drive circuitry includes at least Pixel Logic Circuitry that determines the on-/off state of the pixel as a function of time and Input/Output Circuitry that provides current to the LED. In an embodiment of the present disclosure, there is one set of pixel circuitry foe each Illumination Element (e.g., LED).

In an embodiment of the present disclosure, each Illumination Die (e.g., LED Die) is coupled to (e.g., electrically coupled to) an Operational Die (e.g., Backplane Die). The Operational Die (e.g., Backplane Die) includes a Backplane Substrate, as well as pixel circuitry, and/or pixel-related circuitry.

In an embodiment of the present disclosure, then is made from silicon and is referred to as a Silicon Operational Die (e.g., Backplane Die). In an embodiment of the present disclosure, the Operational Die (e.g., Backplane Die) includes circuitry (e.g., pixel circuitry) that is arranged on, coupled to, integrated into, formed in, deposited on, or embedded into the Backplane Substrate.

In an embodiment of the present disclosure the circuitry (e.g., pixel circuitry) or the drive circuitry is separated into at least the Pixel Logic Circuitry) and the Input/Output Circuitry. In an embodiment of the present disclosure the Pixel Logic Circuitry operates or is located in one or more sections of the Backplane Substrate that are different from one or more sections of the Backplane Substrate where the Input/Output Circuitry operates or is located.

In an embodiment of the present disclosure, the Pixel Logic Circuitry operates or is located in one or more strips or strip-like sections of the Backplane Substrate that are different from one or more strips or strip-like sections of the Backplane Substrate where the Input/Output Circuitry operates or is located.

In an embodiment of the present disclosure, each of the Illuminating Elements is associated with pixel circuitry (i.e., a drive circuit or drive circuitry that drives the illuminating element (e.g., determines the grey level output for an illuminating element). In an embodiment of the present disclosure, each of the Illuminating Elements is associated with its own pixel circuit (i.e., a drive circuit or drive circuitry that drives the illuminating element (e.g., determines the grey level output for an illuminating element). In an embodiment of the present disclosure, each of the Illuminating Elements is associated with Pixel Logic Circuitry or Circuit and Input/Output Circuitry or Circuit. In an embodiment of the present disclosure, the combination of each Illuminating Element (e.g., an LED) and its respective circuitry (e.g., pixel circuitry) that includes, but is not limited to, drive circuitry, form a pixel of the Tile. In an embodiment of the present disclosure, there is an electrical contact element between the LED and the pixel circuitry since they reside on different wafers before bonding. In an embodiment of the present disclosure, the electrical contact element may reside on the wafer where the LEDs are located or on the wafer where the pixel circuitry is located.

In an embodiment of the present disclosure, the combination of each Illuminating Element (e.g., an LED) and its respective circuitry, for example, each Illuminating Element (e.g., an LED) and its respective circuitry (for example, its respective Pixel Logic Circuitry and its respective Input/Output Circuitry), form a pixel of the Tile.

In an embodiment of the present disclosure, an Illumination Element is a Master Illumination Element. In an embodiment of the present disclosure, a Master Illumination Element includes more than one Illumination Element (e.g., LED). In an embodiment of the present disclosure, a Master Illumination Element includes at least three (3) Illumination Elements, for example, a set of three (3) Illumination Elements (e.g., LEDs).

In an embodiment of the present disclosure, a pixel is formed when an Illumination Element (e.g., an LED) is coupled to (e.g., electrically coupled to) circuitry (e.g., pixel circuitry) that drives each Illumination Element (e.g., LED). In an embodiment of the present disclosure, a Master Pixel is formed when a Master Illumination Element (e.g., collection or set of LEDs, for example three (3) LEDs) is coupled to (e.g., electrically coupled to) circuitry (e.g., pixel circuitry) that drives each Illumination Element (e.g., LED) of the Master Illumination Element. In an embodiment of the present disclosure, the Illumination Elements (e.g., LEDs) are collections of the 3 primary colors, and as the LEDs are grouped as collections, with Gaps in between, perceptually seamless abutment is achieved. In an embodiment of the present disclosure, a Tile includes more than one Master Pixel, for example, an array of Master Pixels. In an embodiment of the present disclosure, the pixel circuitry includes at least drive circuitry. In an embodiment of the present disclosure the drive circuitry includes at least Pixel Logic Circuitry and Input/Output Circuitry.

In an embodiment of the present disclosure, Tiles may be arranged, for example, in any pattern, for example, on a PCB. In an embodiment of the present disclosure, Tiles may be arranged, for example, in any pattern, for example, on a PCB to form a display. For purposes of illustrating use of Tiles, in accordance with embodiments of the present disclosure, a pseudo-circular array of tiles is illustrated in FIG. 1. For example, as shown in FIG. 1, a pseudo-circular array of display Tiles is arranged on a printed circuit board (PCB) (not shown) and is utilized for a watch face display. In the example shown, 88 Tiles, in accordance with embodiments of the present disclosure, of 3.6 mm×3.6 mm each, containing 60×60 pixels per Tile are arrayed to form, for example, a 36 mm-diameter watch face. However, it would be understood by one of ordinary skill in the art that the number of Tiles, number of pixels and/or Master Pixels per Tile, the shape of a Tile, and/or the shape of an array of Tiles may vary. In an embodiment of the present disclosure, the pattern or arrangement of Tiles on a PCB may vary.

Figure 2:
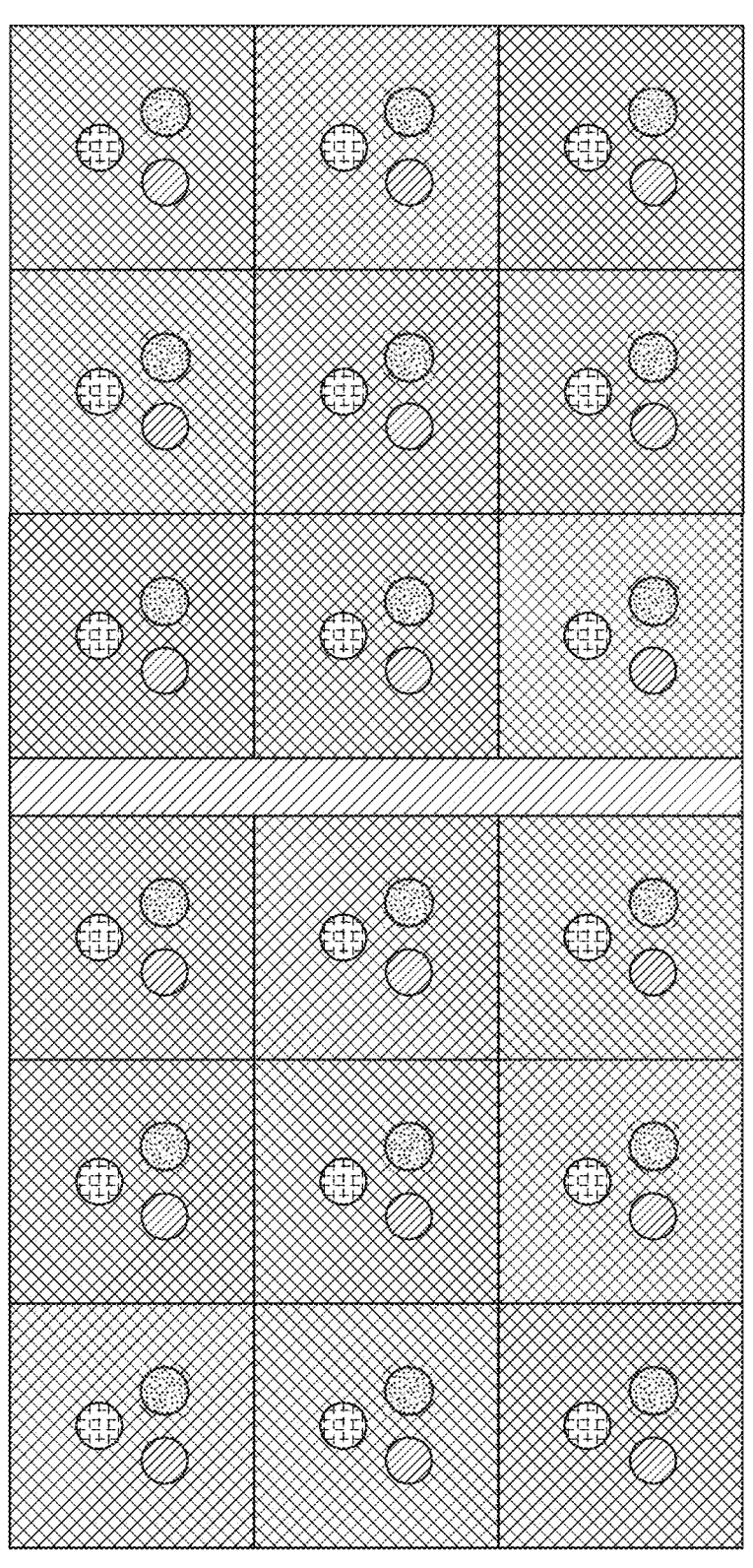
FIG. 2 illustrates Tiles with a seam in accordance with embodiments of the present disclosure.

In an embodiment of the present disclosure, as illustrated in FIG. 2, adjacent Tiles are arranged on a PCB with a space, gap, or seam in between them. As illustrated in FIG. 2, in an embodiment of the present disclosure, there is a space, gap, or seam between sides or edges of two adjacent Tiles (where each Tile has one or more Master Pixels or collections of three (3) Illuminating Elements (e.g., LEDs and their associated pixel circuitry). It would be understood by one of ordinary skill in the art that any reference to LEDs includes any type of LED (e.g., LEDs, OLEDs, microLEDs or microOLEDs). As shown in FIG. 2, in an embodiment of the present disclosure, there is a gap, space, or seam between the adjacent Tiles. It would be understood by one of ordinary skill in the art that the number and colors of the LEDs in the Master Illumination Element or Master Pixels (e.g., sets of LEDs and/or circuitry electrically coupled to each of the LEDs) may vary.

In an embodiment of the present disclosure, a pitch (i.e., a center-center distance between Illumination Elements (e.g., Master Pixels, Master Illumination Elements, or collections of Illumination Elements (e.g., LEDs)) must be such that the space between the Illumination Elements (e.g., Master Pixels, Master Illumination Elements, pixels, or collections of Illumination Elements (e.g., LEDs)) is sufficient to allow for a gap, seam, space without interrupting the pixel pitch (i.e., the distance between a center of one Illumination Element (e.g., Master Pixel or Master Illumination Element) and the center of another Illumination Element (e.g., Master Pixel or Master Illumination Element)), and while maintaining that the pixel pitch is the same or substantially/approximately the same for all of the adjacent Illumination Elements (e.g., Master Illumination Elements or Master Pixels) or at least some of the adjacent Illumination Elements (e.g., Master Illumination Elements or Master Pixels). In an embodiment of the present disclosure, when a Tile is a monochromatic Tile, the master pixel and the pixel are the same.

Figure 3:
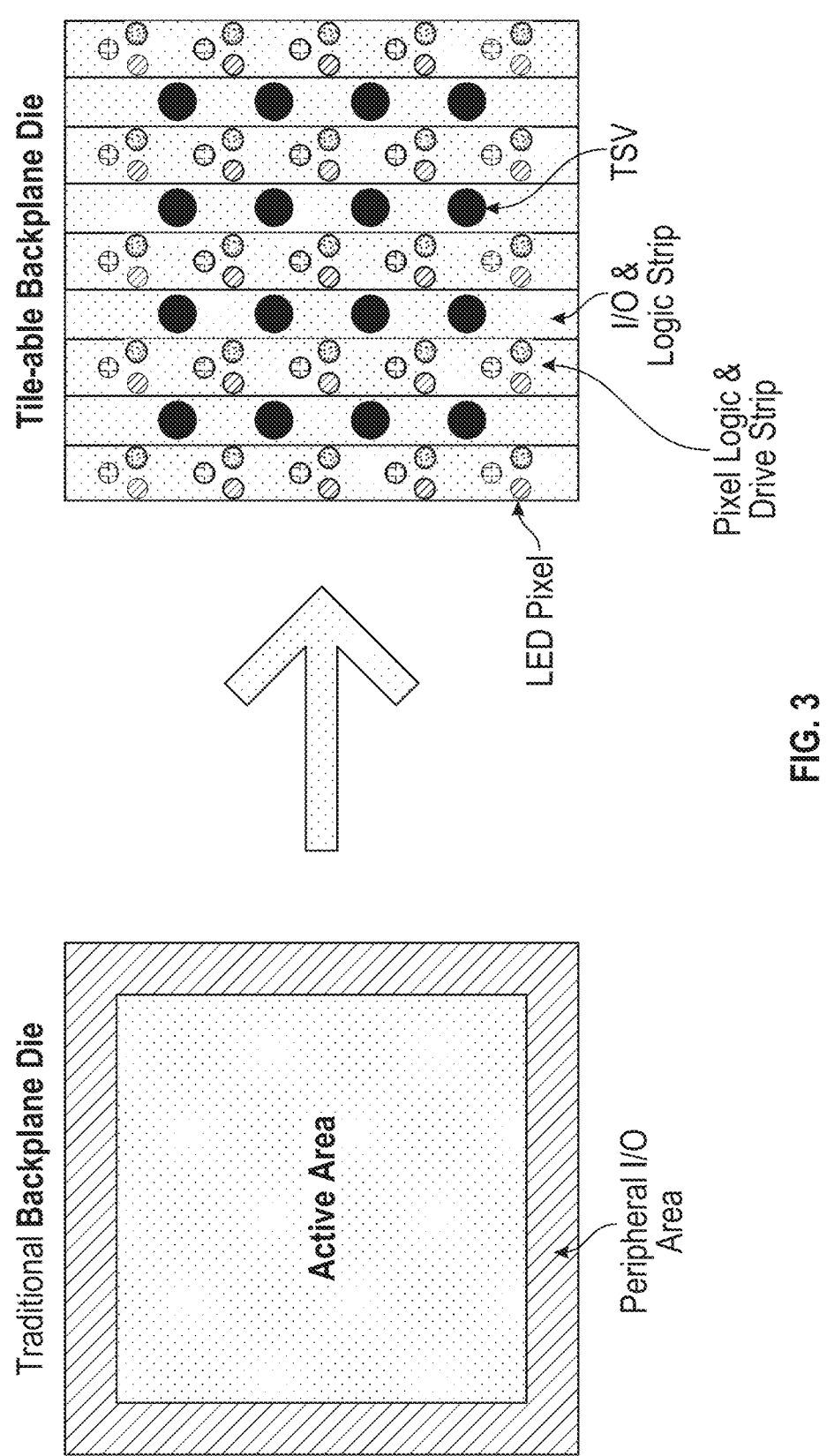
FIG. 3 illustrates Operational Die (e.g., Backplane Die) conversion to a form capable of nearly-seamless abutment, in accordance with embodiments of the present disclosure.

FIG. 3 illustrates the differences between a traditional Backplane Die and a Tiled or Tile-able Operational Die (e.g., Backplane Die), for example, an Operational Die (e.g., Backplane Die (such as a Silicon Backplane Die)), in accordance with embodiments of the present disclosure, that has a form with apparently seamless abutment of Tiles, as the pitch between Master Illumination Elements or Master Pixels is the same. The traditional die floorplan has or includes 1/0 and logic circuitry regions (whereby the input regions include 1/0 buffers and the buffers are utilized to translate between externally used logic levels and internal logic levels, and the logic regions include registers, state machines and pixel drive circuitry, and are utilized to receive image data from the outside, distribute it to pixels in the active area).

In the traditional die plan, the input and logic regions are located or positioned around an active area of the display (i.e., a region containing pixels that will generate, for example, an image). In an embodiment of an Operational Die, in accordance with embodiments of the present disclosure, the Operational Die (e.g., a Tile-able Backplane, Backplane Die such as a Silicon Backplane Die) includes a strips of alternating pixel logic circuitry and 1/0 circuitry. In an embodiment of the present disclosure, the 1/0 circuitry includes 1/0 buffers, and the buffers are utilized to translate between externally used logic levels and internal logic levels. In an embodiment of the present disclosure, the logic regions include registers, state machines and pixel drive circuitry, and are utilized to receive image data from the outside, distribute it to pixels in an active area), and the wiring is arranged in rows and columns, such that the connections to the LED pixels are maintained in an array. In an embodiment of the present disclosure, Illumination Elements, for example, LEDs, may be positioned above the pixel logic circuitry or strips, the 1/0 circuitry or strips, or above both the pixel logic circuitry or strips and the 1/0 circuitry or strips. In an embodiment of the present disclosure, the circuitry strips are embedded in the Backplane Substrate of the Operational Die.

The traditional backplane typically contains peripheral bond pads on a silicon die or bump/pillar connections on a silicon die to connect 1/0 buffers to a circuit board or package. The Tiled or Tile-able Backplane differs from the Traditional backplane, as the Tiled or Tile-able Backplane, in accordance with embodiments of the present disclosure, has Through-Silicon Vias (TSVs) that are utilized to connect or electrically couple one side or a front side of a Operational Die (e.g., a Backplane Die such as a Silicon Backplane Die) on which the Illumination Die (including, for example, the Illumination Elements (e.g., LEDs) or Master Illumination Elements or collections of LEDs that form Master Pixels when coupled or electrically coupled to pixel circuitry) to a second side or back side of the Operational Die (e.g., a Backplane Die such as a Silicon Backplane Die) and/or circuitry of a PCB.

Figure 4:
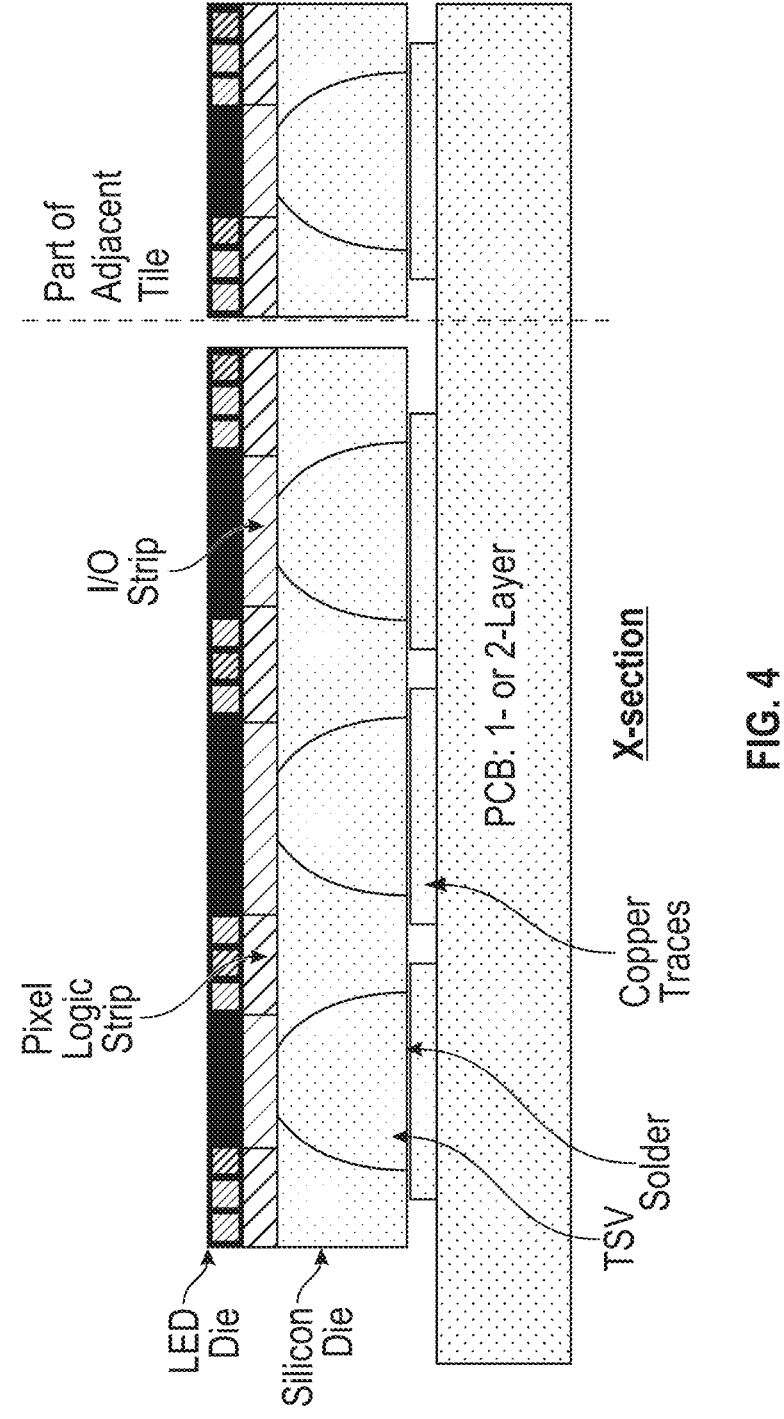
FIG. 4 illustrates Cross-Section of Tile on PCB, in accordance with embodiments of the present disclosure.

FIG. 4 illustrates a Cross-Section of a Tile on PCB. In an embodiment of the present disclosure, a Tile includes an Operational Die (e.g., a Backplane Die, such as a Silicon Backplane Die or wafer) coupled (e.g., bonded and/or electrically coupled) to an Illumination Die (e.g., an LED wafer or die) using bonding and connection methods that are well known in the art.

In an embodiment of an Illumination Die, in accordance with embodiments of the present disclosure, LEDs are formed in, integrated into, or fabricated in a substrate, for example, a Ga N substrate. However, it should be understood by one of ordinary skill in the art that the substrate material may vary, for example, the substrate may be any semiconductor material capable of forming light-emitting structures. In an embodiment of the present disclosure, metallic contacts are coupled to or integrated into the Illumination Die (e.g., LED Die) for electrically coupling the Illumination die to the Operational Die (e.g., Backplane Die, silicon die or Silicon Operational Die).

An Illumination Device (e.g., a Tile), in accordance with embodiments of the present disclosure, includes Vias (e.g., Through substrate vias or Through-silicon Vias (TSVs)) that are used to make connections between a first or back side and a second or front side of the Operational Die (e.g., silicon die) and the power supplies and interfaces, so as to provide power to the Tile circuitry (e.g., the 1/0 logic circuitry and/or strip, the pixel circuitry logic circuitry and/or strip, and/or the conductive circuitry portions (e.g., copper deposits or other electrical conductive elements) deposited on, coupled to, or integrated into the PCB. In an embodiment of the present disclosure, the Vias (e.g., Through substrate vias or Through-silicon Vias (TSVs)) receive the data voltage inputs at the 1/0 buffers, and are utilized to connect power and ground devices, components, and or sources to the Illumination Die (e.g., LED Die) and/or the Operational Die (e.g., Backplane Die).

In an embodiment of the present disclosure, the openings of the Through substrate vias, for example, Through-silicon Vias (TSVs), at or on the back of the Operational Die (e.g., silicon die) are wetted with solder or other conductive material for solder attachment to an underlying PCB or circuitry of an underlying PCB.

In an embodiment of the present disclosure, the Tile circuitry (e.g., 1/0 Logic circuit or circuitry strips and pixel or drive circuitry logic strips) is deposited, formed in, embedded, or integrated into the Operational Die (e.g., Backplane Substrate, Silicon Operational Die, or Backplane Die or silicon die). In an embodiment of the present disclosure, the Illumination Die (e.g., LED Die) is at least electrically connected, coupled and/or bonded to the Operational Die, and the silicon die is connected, coupled, electrically coupled or connected, and/or bonded to a PC. In an embodiment of the present disclosure, there is connectivity between Tiles or between an array of Tiles via a PCB (i.e., a substrate that accommodates the Tiles or a substrate on which the Tiles are located, coupled, bonded, or positioned).

In an embodiment of the present disclosure, circuitry or one or more conductive elements are deposited onto, fabricated in, or integrated into the PCB (for example, on one or more sides of the PCB), and are utilized, for example: (1) to electrically connect the Illumination Die (e.g., LED Die) and/or Operational Die (e.g., Backplane Die) to power sources, or power, sources of data, sources of voltages, and/or sources of current and/or (2) to receive data, voltages, or other inputs. In an embodiment of the present disclosure, the circuitry or conductive elements or deposits on the PCB are made from a copper material and may be referred to as a copper traces or a copper trace. However, it would be understood by one of ordinary skill in the art that the conductive may be made from a conductive material other than copper. The PCB also serves as a structure that provides support, rigidity, or a rigid surface to an array of Tiles. In an embodiment of the present disclosure, the PCB may include one, two, or more layers of circuitry (e.g., any tile-related circuitry).

Figure 5:
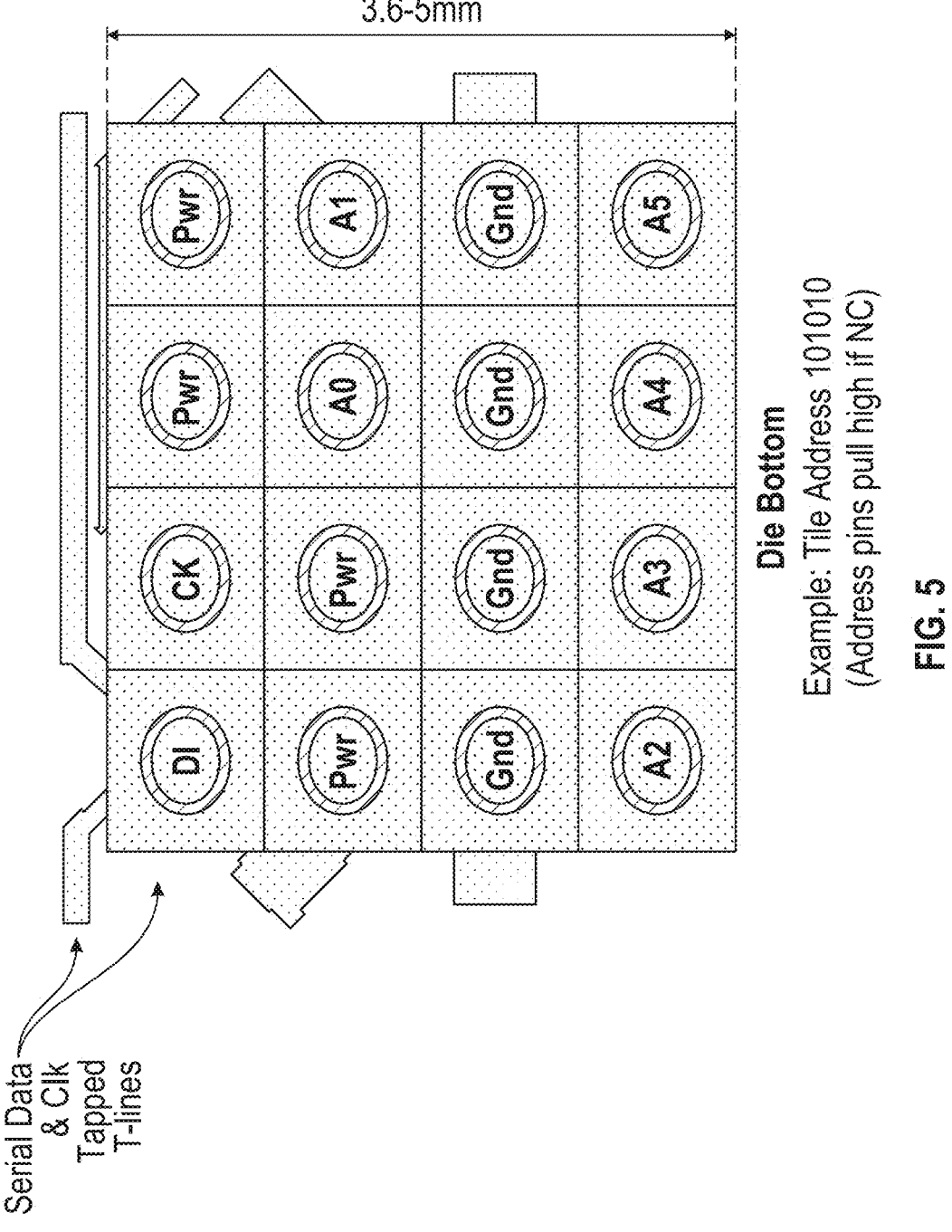
FIG. 5 illustrates a backside of a Tile, in accordance with embodiments of the present disclosure.

FIG. 5 illustrates a backside of a Tile. In an embodiment of the present disclosure, as illustrated in FIG. 5, at the back or bottom of the Tile are an array of TSV openings, that are utilized to receive, for example, input data or voltages, output data or voltages, or signals. In an embodiment of the present disclosure, the TSV openings may be utilized to electrically connect the Illumination Die (e.g., LED Die) to circuitry of the PCB (e.g., circuitry (1) to electrically connect the LED Die to power sources, or power, sources of data, sources of voltages, and/or sources of current and/or (2) to receive data, voltages, or other inputs. In an embodiment of the present disclosure the TSVs may be utilized to output data from a Tile.

Figure 6:
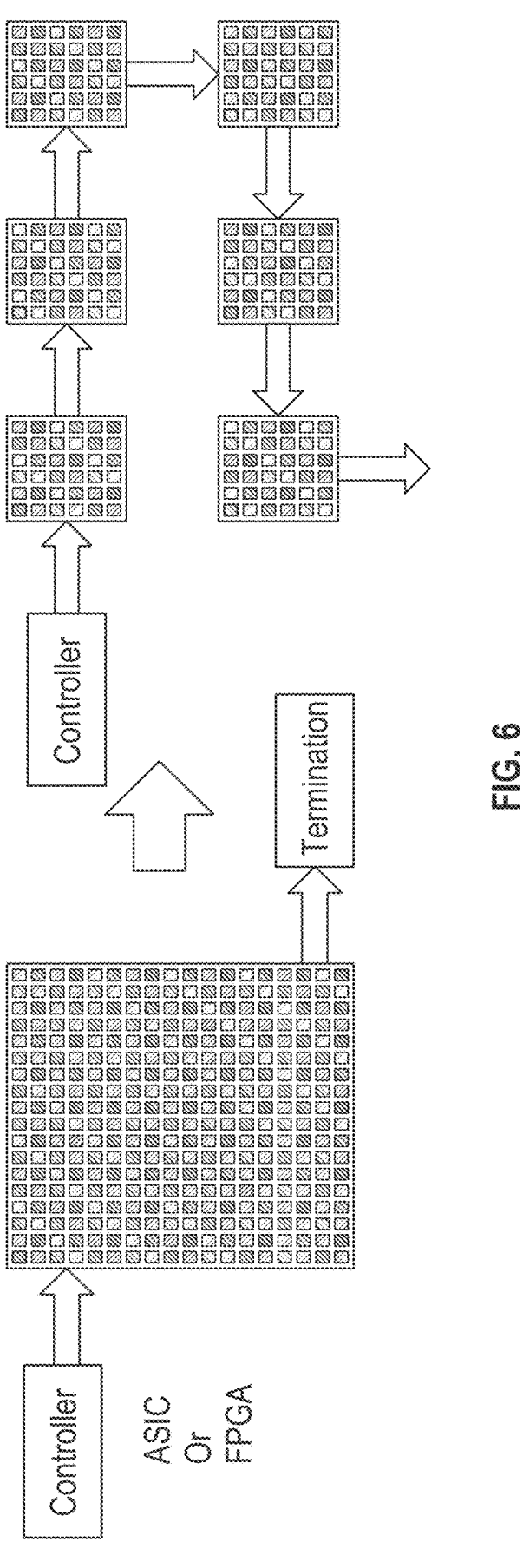
FIG. 6 illustrates a Connection of Tiles to form an array in accordance with embodiments of the present disclosure.

Shown in FIG. 5, are, for example, Vias in an Operational Die (e.g., Silicon Die) that are utilized to make power connections between the PCB (which may be connected to a voltage source or some other source of power) and the Illumination Die (e.g., LED Die). FIG. 5 also illustrates an embodiment of the present disclosure, that has an example I-layer wiring pattern of the PCB, for example, wires or conductive elements deposited on the PCB or embedded in the PCB. In an embodiment of the present disclosure, the TSV labeled DI is utilized to connect serial Data input from a controller (which is illustrated in FIG. 6 and may be referred to as the Tile Array Controller, Array Controller, and/or Master Controller) to the Tiles. In an embodiment of the present disclosure, the controller, illustrated in FIG. 6 is external to a Tile and/or an array of Tiles. In an embodiment of the present disclosure, the controller (e.g., Tile Array Controller or Master Controller) is located or coupled to a substrate, such a PCB, to which the Tiles are also coupled or located. In an embodiment of the present disclosure, this controller controls the operation of a Tile, each Tile in an array of Tiles, and/or the operation of the array of Tiles as a unit. In an embodiment of the present disclosure, the controller (e.g., Tile Array Controller or Master Controller) distributes the data to the tiled and controls when they display new data. In an embodiment of the present disclosure, the arrows between the Controller of FIG. 6 and the arrows between the Tiles of FIG. 6, represent the Serial Data and Clock Tapped Transmission ("T") lines (i.e., conductive elements (e.g., wireline elements, for example, copper line wire elements) that are illustrated in FIG. 5, with respect to the PCB.

The TSV labeled CK is used to connect a clock voltage output from the controller to the Tiles to sample the serial data and provide a clock to the logic circuitry of the Tile. The Tile receives serial data (DI) and clock output (CK) from the controller, as will be described with respect to FIG. 6.

In an embodiment of the present disclosure, at least one Via is utilized to connect or deliver power to a Tile and/or Illumination Die (e.g., LED Die) via, for example, via a power rail (e.g., conductive elements, ground elements/ components, wireline, and/or other components that are coupled to, deposited on, embedded in, and/or on integrated into the PCB) that is coupled or electrically connected to the Operational Die (e.g., Backplane Die or Silicon Operational Die). As a result, power is provided to the Illumination Device (e.g., a Tile and/or Illumination Die (e.g., LED Die), in accordance with embodiments of the present disclosure.

In an embodiment of the present disclosure, the Illumination Die (e.g., LED Die) is coupled to the Operational Die (e.g., Silicon Operational Die or Backplane Die). In an embodiment of the present disclosure, Through-Silicon Vias (e.g., four TSVs) are utilized to connect the PCB to the power rail (i.e., VDD) of the Illumination Die (e.g., LED Die) and/or Tile, and provides sufficient current-carrying capacity and low resistance. It would be understood by one of ordinary skill in the art that the number of Vias utilized to connect components of an Operational Die (e.g., Back plane Die) to a power source, other components of a display system, the PCB, and/or other components of the PCB (or electrically coupled to the PCB) may vary.

In an embodiment of the present disclosure, the controller (e.g., Tile Array Controller, Array Controller, Master Con troller, and/or master controller chip), broadcasts or sends data to all of the Tiles or is utilized to broadcast or send data to all of the Tiles, or at least a portion of the Tiles, and each Tile (or at least some of the Tiles) knows which portion of the data to keep for itself based on its (i.e., the Tile's) address or, for example, based on how a Tile's address pins are tied. In an embodiment of the disclosure, the controller (e.g., Array controller) sends the data to a first Tile, and the data is then subsequently streamed or transmitted to a next Tile in array of Tiles. In an embodiment of the present disclosure, each Tile identifies and extracts data destined for it accord ing to information in a header associated with the data sent from the controller (e.g., Array Controller, Master Control ler, or master controller chip), as illustrated in FIG. 6, In an embodiment of the present disclosure, each Tile may receive data (for example, data represented as a voltage waveform or pulse) according to the address of the Tile identified in the address bits of the data received, from the controller (e.g., Array Controller, Master Controller, or master controller chip), at the array. For example, in an embodiment of the present disclosure, each of the TSVs, labeled A0-A5, iden tify a location within the LED or Master Pixel array, and is electrically connected to a pixel, Master Pixel, and/or LED in the array of LEDs, Master Illumination Elements or Master Pixels.

In an embodiment of the present disclosure, as illustrated in FIG. 6, Tiles are assembled into an array of Tiles and electrically interconnected (by, for example, by wireline) via, for example, a serial bus consisting of a data signal and optionally a clock signal. In an embodiment of the present disclosure, a controller (e.g., Array Controller, Master Controller, or master controller chip), as illustrated in FIG. 6, converts incoming image or video data of a format, for example, a standard format (e.g., MIPI DSI) into a custom serial format that the Tile can process.

The first or left side of FIG. 6 illustrates an array of Tiles, and a second or right side of the Tile (the side to which the arrow is pointing) illustrates that the array is composed of a multiple Tiles that are serially connected, and controlled by the controller (e.g., Array Controller, Master Controller, or master controller chip), that is coupled to at least one of the Tiles of the series of Tiles or multiple Tiles.

In an embodiment of the present disclosure, a custom format is determined in accordance with embodiments of being able to distribute data to all Tiles and having each Tile easily able to capture its own portion of the data. In an embodiment of the present disclosure, each Tile has a predetermined position in the array, as described with FIG. 5, and saves and/or displays data identified for it as a recognizes or knows its address, and knows how the data on the serial data input is arranged as it travels along the bus that is associated with its address or its geographical location or portion of the array (i.e., the whole array or at least a portion of the array). In an embodiment of the present disclosure, a Tile ignores any data on the serial bus that is not associated with its address.

In an embodiment of the present disclosure, a tapped transmission line, with a termination at the end, includes transmission line segments, and each transmission line segment (i.e., a transmission line segment between two Tiles in series) is tuned, by adjusting the width, in accordance with embodiments of transmission line matching methods (i.e., methods for providing a transmission path free of impairments such as reflections and for matching the impedance between the transmission line and the Tiles and or other components (e.g., electrical components) to which the transmission line is electrically connected, to give a controlled transmission line impedance when combined with the input capacitance of the data input or data input pin connections on each Tile).

In an embodiment of the present disclosure, while new data is arriving at a Tile from, for example, a source of image or video data, the previous image or video frame's data is being displayed, and allows for the new data or the next frame's data to be transmitted over the period of the entire video frame (i.e., the frame that is being displayed), which reduces the required data rate. For example, an array (e.g., an array of Master Pixels or Master Illumination Elements) in an embodiment of the present disclosure, as shown in FIG. 1, provides, for example, 220,000 pixels, with 660,000 sub-Illuminating Elements (e.g., sub-pixels (e.g., red, green, blue LEDs)) each needing 8 bits of data to define their brightness. In an embodiment of the present disclosure, the serial data rate required to support the embodiment illustrated in FIG. 1 is a 60 Hz refresh rate at 158.4 Mb/s.

Figure 7:
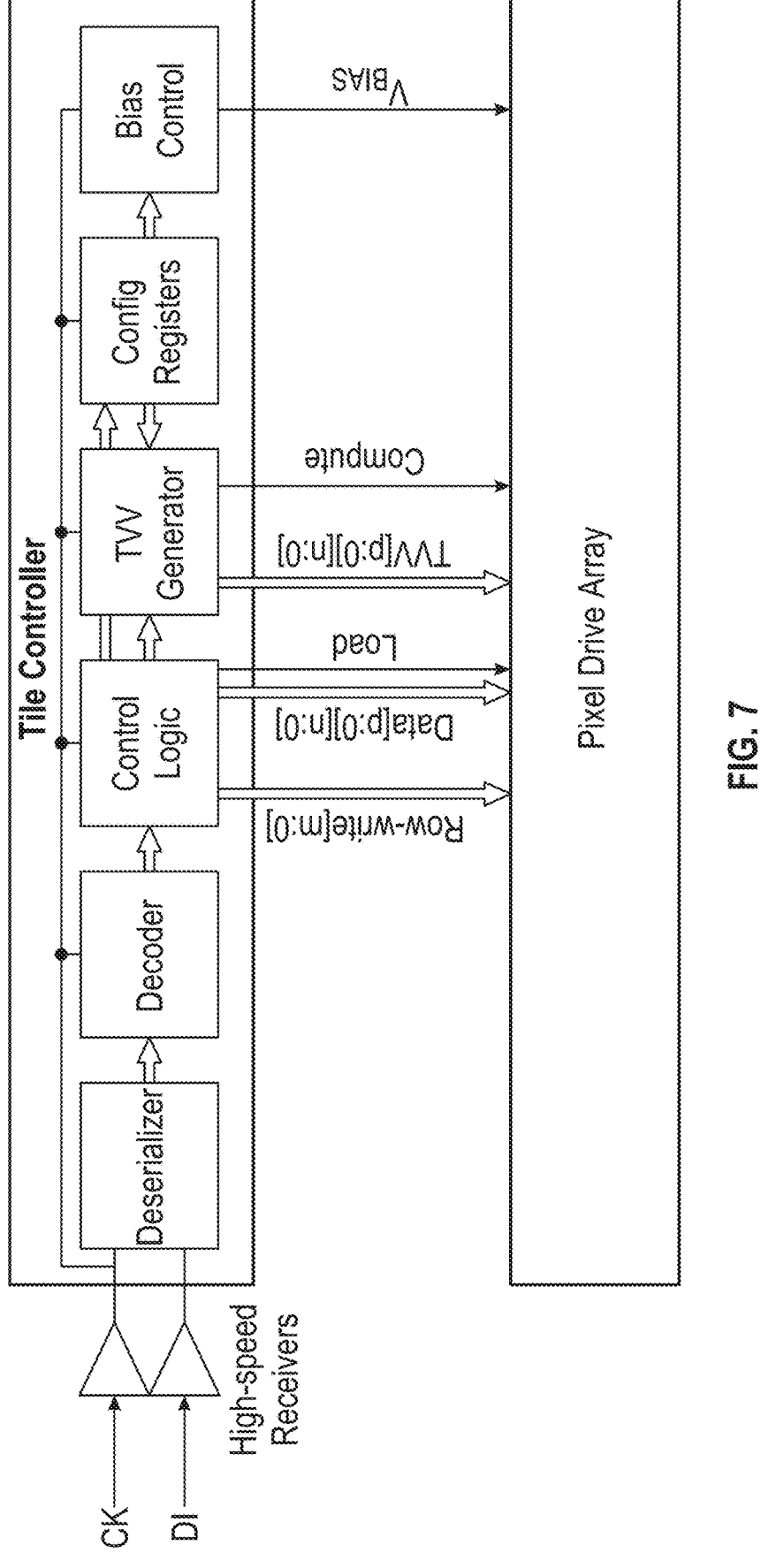
FIG. 7 illustrates Tile Backplane Circuitry in accordance with embodiments of the present disclosure.

FIG. 7 illustrates an embodiment of backplane circuitry, for example, Operational Die (e.g., silicon die or Tile Backplane) circuitry, in accordance with embodiments of the present disclosure. In an embodiment of the present disclosure, (1) an Operational Die (e.g., backplane or backplane die) circuitry of a Tile, includes or is coupled to receivers for the DIN (i.e., data inputs/signals) and CLK inputs/signals (e.g., serial data and clock voltage inputs), logic circuitry, algorithms, and/or software algorithms or modules to decode serial data received at a receive logic circuit, circuitry, or block, and (2) the Operational Die (e.g., backplane or backplane die) circuitry of a Tile determines when such serial data is loaded into an array of pixel circuits, and when to update the pixels to display loaded data. In an embodiment of the present disclosure, the pixel circuits (as illustrated in FIG. 7) are included in the Operational Die (e.g., Backplane, Backplane Die or silicon die) circuitry, and the pixel circuits contain both receiving and active storage devices (e.g., memory devices). It would be understood by one of ordinary skill in the art that the pixel circuits may use any modulation method to drive the pixel circuits. A pixel structure, in accordance with embodiments of the present disclosure, will be further described in FIG. 8.

The Tile controller logic circuitry and/or device extracts data from the serial data stream (represented by, for example, a voltage waveform) transmitted over the serial bus that is destined for the Tile, and puts it on the DATA bus for the column of the pixel array to which it should be written, then uses the ROW-WRITE strobe to load it into the Master Pixel.

Figure 8:
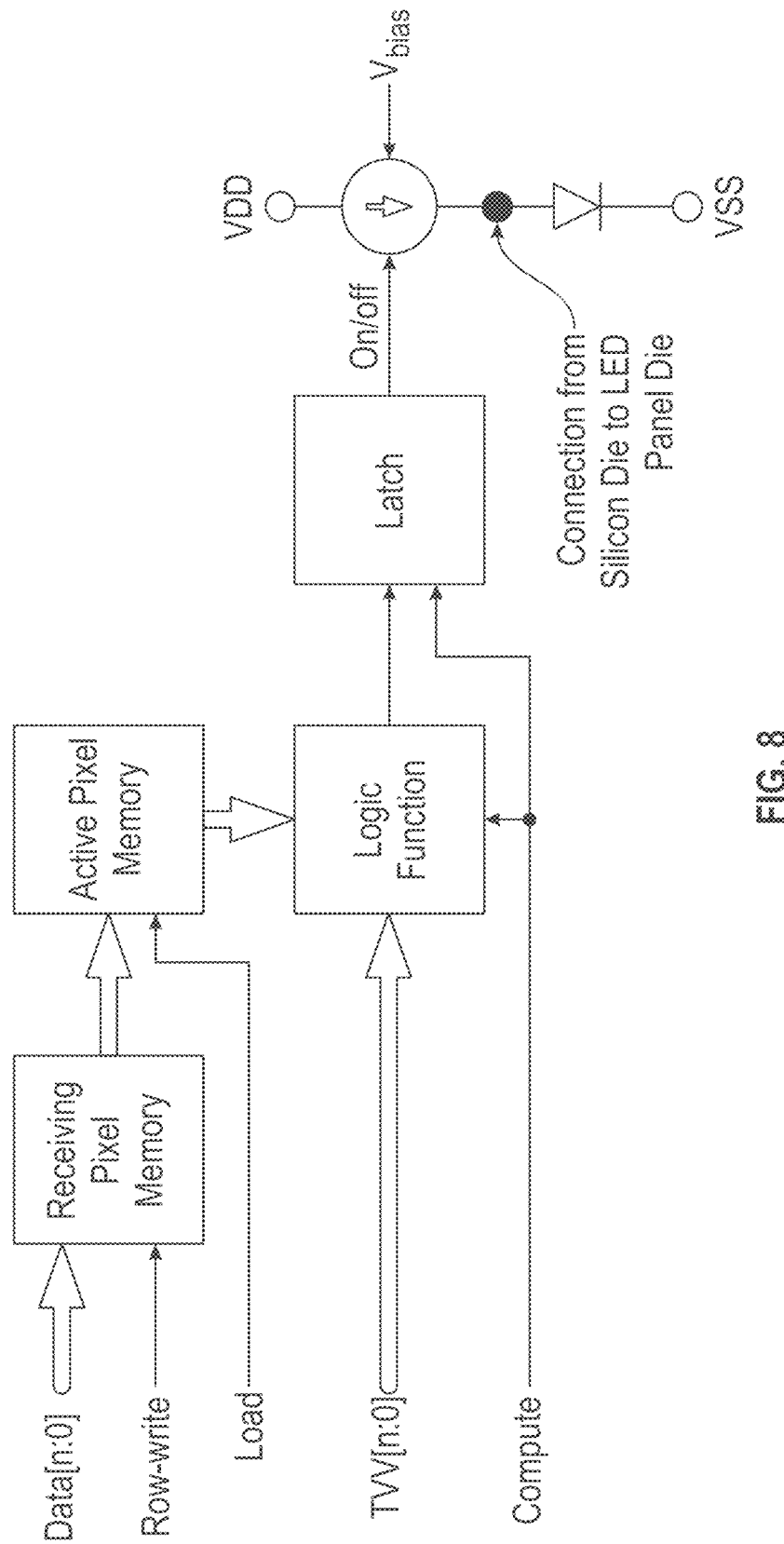
FIG. 8 illustrates Individual Pixel Circuitry, in accordance with embodiments of the present disclosure.

The Tile controller also produces a LOAD output control voltage to all Master Pixels or Master Illumination Element in the Tile (or at least a subset thereof) that controls the transfer data from the receiving memory to an active memory, and outputs a Time Varying Value on the TVV bus, which will be further described in FIG. 8.

The Tile control logic/circuitry/software/device also includes a Time-Varying-Value (TVV) generator which creates a changing digital pattern for use by the pixels. In an embodiment of the present disclosure, a bias control circuit, software, and/or device contains a brightness control register that provides a digital value to a DAC and a current DAC that converts the register value to a current. The current is then converted to a voltage suitable for biasing the current sources electrically coupled to the individual pixels or in the pixel circuitry electrically coupled to a pixel.

In an embodiment of the present disclosure, Configuration (Config) registers may be written to from data extracted from the incoming serial data received by the Deserializer, and may be used to control a bias current set by the Bias Control circuitry and/or device. In an embodiment of the present disclosure, the Config Registers may or may also store information about the Tiled display's X and Y pixel count (i.e., the pixel count in each row, and the pixel count in each column) and an activity state (such as sleep or wake) for the Tile.

As shown in FIG. 8, in an embodiment of the present disclosure, each sub-pixel (which is one of a set of, for example, 3, for each Master Pixel or Master Illumination Element, contains an illuminating element (e.g., an LED, microLED, OLED, or microLED device or component) that is electrically coupled to memory elements, for example, two sets of memory elements, logic function circuitry having an output that controls a latch to which it is electrically coupled (e.g., a final latch), a final latch and a current driver to supply modulated current to the LED. It would be understood by one of ordinary skill in the art that the number of memory elements, latches, and current drivers may vary.

In an embodiment of the present disclosure, a receiving storage device (e.g., a memory device or receiving pixel memory device) is loaded with image data or video data (for example, image or video grayscale data, from a Tile controller, which places or transmits data to be written to a Tile, which it has extracted from the serial data stream, by the Deserializer and decoder on the data bus of a column containing the pixel or Master Pixel to be written and then the Tile controller outputs a ROWWRITE signal for the row of the pixel to be written. It should be understood by one of ordinary skill in the art that other row-column scanning methods may be utilized to control the ROWWRITE operation.

Then, in an embodiment of the present disclosure, the Tile controller outputs a LOAD output voltage or signal that initiates transfer of data from the receiving storage device (e.g., a memory device or receiving storage memory device) to the active storage device (e.g., a memory or active pixel memory device). Then, in an embodiment of the present disclosure, the display cycle begins. During this cycle, the Tile controller provides a changing value or voltage on the Time-Varying Value (TVV) bus which pixel logic hardware and/or software or pixel logic hardware device or means and/or software function, algorithm, or module combines with the value (in the case of software) or value represented by a voltage in the active storage device, for example, memory to produce a time-varying voltage, for example, a single-bit voltage, voltage pulse or signal that is used to modulate the current. In an embodiment of the present disclosure, on each change of the TVV bus by the Tile controller, a COMPUTE signal or output generated by a counter in the Tile controller is asserted or output to logic function circuitry and/or a latch to induce the computation of the single-bit output or signal and latch it into the final latch, whose output directly controls the on/off state of the current source. The modulation by the pixel logic hardware and/or software may be any of a variety of resulting digital patterns, for example, PWM or binary-weighted pulse widths, serves to vary the brightness of each pixel according to the data that was loaded into the storage devices (e.g., memories).

Figure 9:
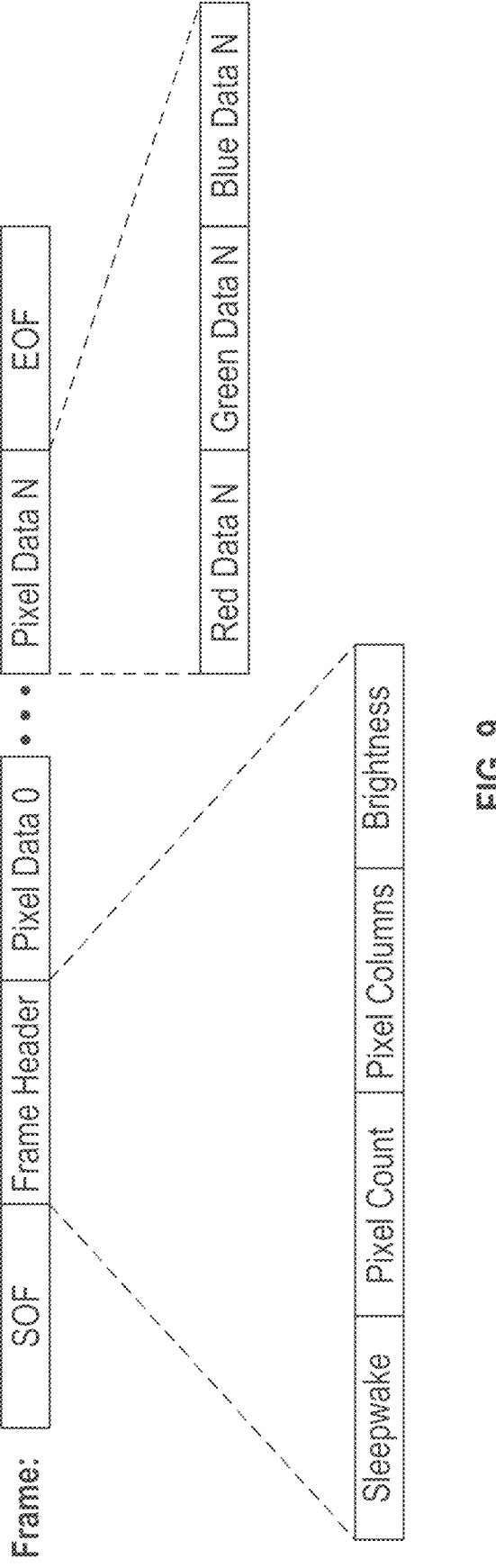
FIG. 9 Serial Stream format, in accordance with embodiments of the present disclosure.

In an embodiment of the present disclosure, the serial data stream from the Tile Array Controller or Master Controller to the Tiles is formatted in frames corresponding in duration and frequency to a refresh rate of the display. In an embodiment of the present disclosure, as illustrated in FIG. 9, each frame contains a start-of-frame (SOF) marker, containing a unique pattern which the decode logic circuitry of the Tile controller can use to robustly detect the start of a frame (i.e., in data received by the Tile), followed by header information that describes the contents of the video data, such as a number of words and number of bits in each word to expect in the data stream, information about the number of pixels per row in the display as configured, and also containing global (i.e., for the entire pixel array or a predetermined portion thereof) register updates, such as brightness control or sleep/wake status.

In an embodiment of the present disclosure, a serial stream of data transmitted to the Tiles from the Tile controller or display controller may be encoded, for example, 8b1Ob or 8b9b encoding, in order to provide robust transmission and reception, detection of errors, and unique symbols for start of frame and other control purposes (for example, power-state control for a Tile). Each Tile saves its individual data, using its address to index into the received pixel data and identify the start and end of the data destined for that Tile.

In accordance with some embodiments of the present disclosure, a display device includes an Illumination Die, where the Illumination Die comprises at least one Illuminating Element at least one of coupled to, formed in and integrated into an illuminating element substrate; and a backplane device coupled to the Illumination Die, and where the backplane device comprises a Backplane Substrate and pixel circuitry, and the pixel circuitry is at least one of embedded in, integrated into, formed on, or coupled to the Backplane Substrate, and wherein said pixel circuitry comprises Pixel Logic Circuitry and input/output logic circuitry.

In some embodiments, the pixel circuitry comprises drive circuitry. In some embodiments, the at least one Illuminating Element comprises three Illuminating Elements. The Illuminating Elements are LEDs in some embodiments and are microLEDs in other embodiments. In some embodiments, the pixel circuitry is electrically coupled to the at least one illuminating element, and the pixel circuitry drives the at least one of the illuminating elements. In some embodiments, the pixel circuitry is coupled by conductive elements to the at least one Illuminating Element, and the pixel circuitry drives the at least one of the Illuminating Element.

In some embodiments, the backplane device is manufactured from a material comprising silicon or other semiconductor in which transistors may be formed. In some embodiments, the Illumination Element has a conductive portion, and the pixel circuitry contains conductive portions for electrically coupling the Illumination Element to its respective pixel circuit. The backplane device has TSVs in some embodiments, with a topside of the backplane device is connected to a backside of the backplane device by a conductive material or device on an end of the TSVs. In some embodiments, a PCB is electrically coupled to the backplane device via conductive elements that couple the PCB and the backplane device utilizing the TSVs. In some embodiments, the at least three Illumination Elements form a first Master Pixel. The display device comprises a second Master Pixel in some embodiments, where the second Master Pixel is electrically coupled to the first Master Pixel via electrical conductive components or wireline. In some embodiments, the first Master Pixel and the second Master Pixel form a Tile.

In some embodiments, a display device comprises a plurality of Tiles, wherein a Tile comprises an Illumination Die. The Illumination Die comprises at least one illuminating element at least one of coupled to, formed in and integrated into an illuminating element substrate; and a backplane device coupled to the Illumination Die, wherein the backplane device comprises a Backplane Substrate and pixel circuitry, and wherein the pixel circuitry is at least one of embedded in, integrated into, formed on, deposited on, and coupled to the Backplane Substrate. The pixel circuitry comprises Pixel Logic Circuitry and input/output logic circuitry and a PCB. The plurality of tiles are electrically coupled via circuitry at least one of at least one of embedded in, integrated into, formed on, deposited onto and coupled to the Backplane Substrate and circuitry at least one of at least one of embedded in, integrated into, formed on, deposited onto and coupled to the PCB.

In some embodiments, the Pixel Logic Circuitry is at least one of arranged on, embedded in, integrated into, formed on, deposited onto or coupled to a first strip area of the Backplane Substrate. The input/output logic circuitry is at least one of arranged on, embedded in, integrated into, formed on, deposited onto or coupled to a second strip area of the backplane in some embodiments.

In some embodiments, a display system comprises a Tile controller, where the Tile controller controls operation of each Tile in an array or plurality of Tiles, and is included or integrated into an Operational Die of each of the Tiles, and where each Tile of the plurality of tiles has a Tile address. A Master controller is coupled to at least one of the Tiles in the plurality or array of Tiles, where the Master controller sends data to the Tile to which it is coupled, and wherein the Tile controller identifies Tile data in the data received from the Master controller, and wherein Tile data is a subset of the data sent from the Master controller, and wherein the Tile controller associated with the Tile address stores the Tile data at a memory component in, or associated with, the Tile.

In some embodiments, the data sent from the Master controller includes a Tile address in a header of the data sent from the Master controller. In some embodiments, the Master controller receives data from a first device of a first format, and wherein the Master controller converts the data to a second format suitable or that can be read or processed by the Tile or the Tile controller associated with the Tile.

In some embodiments, the first device is a device that generates and/or outputs images or image data. The Tiles of the plurality or array of Tiles are electrically connected in series in some embodiments. In some embodiments, image or video data is being sent to a Tile for display in a next frame while image or video data for a current frame is being displayed on the Tile. In some embodiments, each Tile comprises Illumination Elements, and each Illumination Element is coupled to a first storage device and a second storage device.

In some embodiments, the display system further comprises logic function circuitry electrically coupled to a latch, where the logic function circuitry performs a computation or Boolean logic function such as an equivalence or comparison function and generates an output that is received by a latch to which the logic function circuitry is coupled, and wherein the latch stores the output of the logic function circuitry, and wherein the latch is also electrically coupled to a current driver circuit or component, and wherein the current driver circuit or component is electrically coupled to an illuminating element, and wherein the current driver circuit or component supplies modulated current to the illuminating element, and wherein the current driver circuit or component may supply modulated current to the illuminating element in accordance with the output generated by the logic function circuitry.

In some embodiments, a display system comprises a Pixel Array of pixel elements, where each Illumination Element of a pixel or each Illumination Element of a Master Pixel of the pixel array is electrically coupled to pixel circuitry comprising a first storage device or receiving pixel memory device; a second storage device or active pixel memory device electrically coupled to the receiving pixel memory device. Logic function circuitry is coupled to the active pixel memory device. A latch is coupled to the logic function circuitry; and a current drive device coupled to the latch, and wherein the current drive device drives operation of each pixel or Master Pixel of the pixel array. A Tile controller comprises a Deserializer that receives incoming data from the receiving storage device. A Decoder is electrically coupled to the Deserializer, and the Deserializer extracts image or video data from a data stream, received at the Deserializer of the Tile controller, according to or when a Tile's address is in the data stream, and wherein the Deserializer controls writing of the extracted data to the first storage device or receiving pixel memory device.

In some embodiments, the Decoder decodes the extracted data after it has been extracted from the data stream, and wherein the Tile controller instructs a control logic block to write the extracted and subsequently decoded data to be placed on a data bus corresponding to or associated with a column that includes or contains Illuminating Elements, pixel, Master Pixel, LED, or collection of LEDs that has been identified as a destination for writing the extracted and subsequently decoded data. In some embodiments, the Tile controller outputs a ROW/WRITE output or signal to the row of the Illuminating Elements, pixel, Master Pixel, LED, or collection of LEDs that have been identified to receive the extracted and subsequently decoded data.

In some embodiments, the display system further comprises Control Logic circuitry of the Tile controller that outputs a LOAD output voltage or signal that initiates transfer of data from the receiving storage device to the second or active storage device. In some embodiments, the display system further comprises a TVV (Time-Varying Value) Generator, where after the data has been transferred to the second or active storage device, a display cycle begins, wherein during the display cycle, the TVV Generator provides a changing value or voltage on a Time-Varying Value (TVV) bus which pixel logic circuit or pixel logic device combines with the value or voltage in the second or active storage device, and produces a time-varying voltage that is used to modulate a current driver circuit or device electrically coupled to a Master Pixel or Master Illumination Element.

In some embodiments, on each change of the TVV bus by the TVV Generator, a COMPUTE signal or output generated by a counter in the TVV Generator of the Tile controller to logic function circuitry of the Pixel Array and/or a latch, and wherein the logic function circuitry computes or performs a Boolean logic function and generates a single-bit output or signal and outputs it to the latch, and wherein the output of the latch directly controls an on/off state of a current source and thereby an on/off state of the pixel, Master Pixel, LED, or collection of LEDs.

The above-described embodiments are merely exemplary illustrations of implementations that are set forth for a clear understanding of principles. Variations, modifications, and combinations may be made to the above-described embodiments without departing from the scope of the claims. All such variations, modifications, and combinations are included herein by the scope of this disclosure and the following claims.

The invention claimed is:

1. A display device, comprising:

a plurality of tiles arranged in an array on a printed circuit board (PCB), the PCB configured to electrically couple the plurality of tiles, each tile comprising:

an illumination die comprising at least one illuminating element; and a tile-able backplane die comprising:

pixel logic circuitry at least one of arranged on, embedded in, integrated into, formed on, deposited onto or coupled to a first area of a backplane die; and input/output logic circuitry at least one of arranged on, embedded in, integrated into, formed on, deposited onto or coupled to a second area of the backplane die;

wherein the illumination die is coupled to a front surface of the tile-able backplane die such that the first area is aligned with at least one illuminating element in the illumination die; and wherein each respective tile is coupled to the printed circuit board through a plurality of openings in a back surface of the respective tile-able backplane die, the plurality of openings in the back surface aligned with the second area of the backplane die.

2. The display device of claim 1, wherein:

the first area comprises a first strip area; and the second area comprises a second strip area.

3. The display device of claim 1, wherein:

the first area comprises a plurality of first strip areas; and the second area comprises a plurality of second strip areas alternating with the plurality of first strip areas.

4. The display device of claim 1, wherein the PCB electrically couples the plurality of tiles in series.

5. The display device of claim 1, wherein image or video data is being sent to the input/output logic circuitry of a tile for display in a next frame while image or video data for a current frame is being displayed on the illumination die of the tile.

6. The display device of claim 1, wherein:

each tile of the plurality of tiles has a corresponding tile address;

the PCB comprises a master controller coupled to at least one of the tiles in the plurality of tiles;

the master controller sends data to the tile to which it is coupled, the data having a header including a tile address identifier;

the backplane device of a tile identifies tile data in the data received from the master controller, the tile data being a subset of the data sent from the master controller; and the backplane device of the tile associated with the tile address identifier stores the tile data at a memory component in, or associated with, the tile.

7. The display device of claim 6, wherein:

the master controller receives data from a first device of a first format; and the master controller converts the data to a second format that can be read or processed by the backplane device of a tile.

8. The display device of claim 7, wherein:

the first device is a device that outputs image data.

9. The display device of claim 7, wherein:

each illumination element of an illumination die is coupled to a first storage device and a second storage device.

10. A display system comprising:

a pixel array of pixels, each pixel having at least one illuminating element in an illumination die, each illumination element of a pixel being electrically coupled to pixel circuitry in a tile-able backplane die of a tile, the tile-able backplane die comprising:

pixel drive and logic circuitry on a first area of the backplane die comprising:

a receiving pixel memory device;

an active pixel memory device electrically coupled to the receiving pixel memory device;

logic function circuitry coupled to the active pixel memory device;

a latch coupled to the logic function circuitry; and a current drive device coupled to the latch, wherein the current drive device drives operation of each pixel of the pixel array; and tile controller circuitry on a second area of the backplane die comprising circuitry configured to:

receive a serial data stream;

extract image data or video data from the serial data stream according to when an address of the tile is in the data stream;

decode the image or video data after it has been extracted from the data stream;

control writing of the image or video data to the receiving pixel memory device; and write the image data or video data that has been extracted and subsequently decoded to a data bus corresponding to or associated with a column that includes or contains one or more pixels of the pixel array, the column being identified as a destination for writing the image data or video data;

wherein the illumination die is coupled to a front surface of the tile-able backplane die such that the first area is aligned with at least one illuminating element in the illumination die, wherein the tile-able backplane die comprises a plurality of openings in a back surface of the tile-able backplane die, the plurality of openings configured to receive the serial data stream from a tile array controller.

11. The display system of claim 10, wherein:

the first area comprises a first strip area; and the second area comprises a second strip area.

12. The display system of claim 10, wherein:

the control logic circuitry writes a respective plurality of portions of the image data or video data that has been extracted and subsequently decoded to each of a plurality of data buses corresponding to or associated with a plurality of columns that each include or contain one or more pixels of the pixel array, each column being identified as a destination for writing a respective one of the plurality of portions of the image data or video data;

the first area comprises a plurality of first strip areas; and the second area comprises a plurality of second strip areas alternating with the plurality of first strip areas.

13. The display system of claim 10, wherein the at least one illuminating element of a pixel comprises three illuminating elements generating three colors of light.

14. The display system of claim 10, wherein the tile controller circuitry is configured to output a ROW/WRITE signal to a row of the pixels that have been identified to receive the extracted and subsequently decoded data.

15. The display system of claim 14, wherein the tile controller circuitry is configured to output a LOAD output signal that initiates transfer of data from the receiving pixel memory device to the active pixel memory device.

16. The display system of claim 15, further comprising:

a time-varying value (TVV) generator, wherein after the data has been transferred to the active pixel memory device, a display cycle begins, wherein during the display cycle, the TVV generator provides a changing value or voltage on a TVV bus which the pixel circuitry combines with the value or voltage in the active memory device, and produces a time-varying voltage that is used to modulate a current driver device electrically coupled to a master pixel of the pixel array.

17. The display system of claim 10, wherein the at least one illuminating element of a pixel comprises at least one LED.

18. The display system of claim 17, wherein the at least one LED is at least one microLED.

19. A method, comprising:

transmitting serial data from a master controller to one or more tiles in a plurality of tiles via a printed circuit board, the data having a header including a tile address, the tile address being associated with a first tile of the plurality of tiles;

receiving the serial data at a tile controller of the first tile, the tile controller comprising a backplane, the backplane comprising:

a first area comprising a plurality of first strip areas;

a second area comprising a plurality of second strip areas alternating with the plurality of first strip areas;

pixel logic circuitry at least one of arranged on, embedded in, integrated into, formed on, deposited onto or coupled to the first area, the pixel logic circuitry being coupled to one or more illumination elements in an illumination die coupled to a front surface of the backplane; and input/output logic circuitry at least one of arranged on, embedded in, integrated into, formed on, deposited onto or coupled to the second area, the input/output logic circuitry being coupled to the printed circuit board through a plurality of openings in a back surface of the backplane aligned with the second area; and at the tile controller of the first tile:

recognizing the tile address in the header of the serial data;

identifying tile data as a subset of the serial data received from the master controller; and storing the tile data at a memory component in, or associated with, the first tile.

20. The method of claim 19, further comprising:

receiving, at the master controller, image data of a first format; and converting, at the master controller, the image data from the first format to a serial format to arrive at the serial data.

* * * * *